United States Patent
Gao

(10) Patent No.: US 11,076,508 B2
(45) Date of Patent: Jul. 27, 2021

(54) COOLING SYSTEMS FOR IMMERSION COOLED IT EQUIPMENT

(71) Applicant: Baidu USA LLC, Sunnyvale, CA (US)

(72) Inventor: Tianyi Gao, Sunnyvale, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 0 days.

(21) Appl. No.: 16/684,304

(22) Filed: Nov. 14, 2019

(65) Prior Publication Data

US 2021/0153392 A1    May 20, 2021

(51) Int. Cl.
*H05K 7/20*      (2006.01)

(52) U.S. Cl.
CPC ..... *H05K 7/20818* (2013.01); *H05K 7/20745* (2013.01); *H05K 7/20827* (2013.01); *H05K 7/20836* (2013.01); *H05K 7/203* (2013.01); *H05K 7/2079* (2013.01); *H05K 7/20318* (2013.01); *H05K 7/20327* (2013.01)

(58) Field of Classification Search
CPC ........... H05K 7/20236; H05K 7/20263; H05K 7/20272; H05K 7/203–20327; H05K 7/20763–20781; H05K 7/208–20818; H01L 23/427; H01L 23/44–445; H01L 23/473
See application file for complete search history.

(56) References Cited

U.S. PATENT DOCUMENTS

| | | | | |
|---|---|---|---|---|
| 3,614,693 A * | 10/1971 | Frey, III | .................. | H01F 27/18 336/58 |
| 4,173,996 A * | 11/1979 | Pierce | ..................... | H01F 27/18 165/104.27 |
| 4,501,123 A * | 2/1985 | Ina | .......................... | H01F 27/18 165/104.21 |
| 4,545,502 A * | 10/1985 | Reuter | ..................... | B65F 1/16 220/810 |
| 5,015,337 A * | 5/1991 | Fraser | ................ | B01D 17/0208 202/169 |
| 7,907,395 B2 * | 3/2011 | Weber | ................ | H05K 7/20818 361/679.47 |

(Continued)

*Primary Examiner* — Zachary Pape
(74) *Attorney, Agent, or Firm* — Womble Bond Dickinson (US) LLP

(57) ABSTRACT

According to one embodiment, an information technology (IT) equipment cooling system includes an IT cooling module having one or more pieces of IT equipment that is configured to provide IT services and is at least partially submerged within a liquid coolant. While the equipment provides the services, heat is generated and transferred into the coolant thereby causing at least some of the coolant to turn into a vapor. The system also includes a condenser that is positioned above the module and is configured to condense the vapor back into liquid coolant. The system includes return and supply lines that are both coupled to the condenser and to the module to create a heat exchanging loop. The system includes an accumulator that is disposed on the supply line and is configured to accumulate the condensed liquid coolant before the coolant is provided to the module. The accumulator provides backup cooling capacity for the system. Also, a data center cooling system includes a cooling region and IT region for deploying a single loop immersion cooling system.

19 Claims, 8 Drawing Sheets

(56) References Cited

U.S. PATENT DOCUMENTS

| | | | |
|---|---|---|---|
| 9,389,541 B1* | 7/2016 | Yatsuda | G03G 15/105 |
| 10,674,637 B2* | 6/2020 | Ishinabe | H05K 7/20736 |
| 2012/0106073 A1* | 5/2012 | Wu | H05K 7/20754 |
| | | | 361/679.52 |
| 2017/0325355 A1* | 11/2017 | Lau | H05K 7/20318 |

* cited by examiner ations of the electronic racks or having the immersion tank design to fit into an existing infrastructure as previously mentioned.
COOLING SYSTEMS FOR IMMERSION COOLED IT EQUIPMENT

FIELD

Embodiments of the present disclosure relate generally to a cooling system for immersion cooled information technology (IT) equipment.

BACKGROUND

Thermal management for a data center that includes several active electronic racks is critical to ensure proper performance of servers and other IT equipment (e.g., performing IT services) that is operating in the racks. Without proper thermal management, however, the thermal environment (e.g., temperature) within the racks may exceed thermal operational thresholds, which may result in adverse consequences (e.g., servers failing, etc.). One way to manage the thermal environment is the use of cooling air to cool the IT equipment. The cooling air is recirculated through cooling units. Heat generated by the IT equipment is captured by the cooling air and is extracted by the cooling unit. One common cooling unit is a computer room air conditioning (CRAC) unit that is a device that intakes hot exhaust return air and supplies cooling air to maintain a data center's thermal environment.

Recently, data centers have been deploying more high-power density electronic racks, where more high-density chips are packaged closer together to provide more processing power. Cooling these high-density racks by maintaining a proper thermal environment may be an issue with existing cooling systems, such as a CRAC unit. For instance, although the CRAC unit may maintain the thermal environment with more conventional (or lower-density) racks, the unit may be unable to effectively cool high-power density racks because they may generate heat load at a higher rate due to the higher density electronics. Or significant cost may be needed for upgrading a CRAC system to satisfy a cooling requirement of a high density deployment. Another challenge for air cooling high density racks is moving a large amount of airflow sufficient to cool the racks.

Immersion cooling, on the other hand, which involves at least partially submerging electronics in a dielectric solution is a feasible solution for high-density electronics. Implementing immersion cooling in existing data centers, however, has challenges. For example, a data center's cooling infrastructure may need to be modified to be able to support operating an immersion cooling system, since existing data centers are designed for either air cooling or other types of liquid cooling. Also, immersion cooling is a more complex cooling solution than existing air/liquid solutions. For instance, single-phase immersion cooling requires complex hardware design for electronic components, mechanical pumps that may fail/leak, and significant room modification for deployment in a data center. As another example, conventional two-phase immersion cooling systems include a condenser that is packaged within an immersion tank along with the submerged electronics (e.g., positioned above the electronics). When maintenance is performed (e.g., when a server needs to be replaced), a data center technician must remove the condenser from the tank, thereby breaking the existing cooling loop. In order to prevent overheating while performing maintenance, the electronics within the tank must be shut down, which results in service interruption.

The existing data center cooling market lacks a full system solution from end-to-end for solving the immersion cooling design and deployment challenge. Most of the existing solutions focus on modifications of the electronic racks or having the immersion tank design to fit into an existing infrastructure as previously mentioned.

BRIEF DESCRIPTION OF THE DRAWINGS

The aspects are illustrated by way of example and not by way of limitation in the figures of the accompanying drawings in which like references indicate similar elements. It should be noted that references to "an" or "one" aspect of this disclosure are not necessarily to the same aspect, and they mean at least one. Also, in the interest of conciseness and reducing the total number of figures, a given figure may be used to illustrate the features of more than one aspect, and not all elements in the figure may be required for a given aspect.

DETAILED DESCRIPTION

Figure 1:
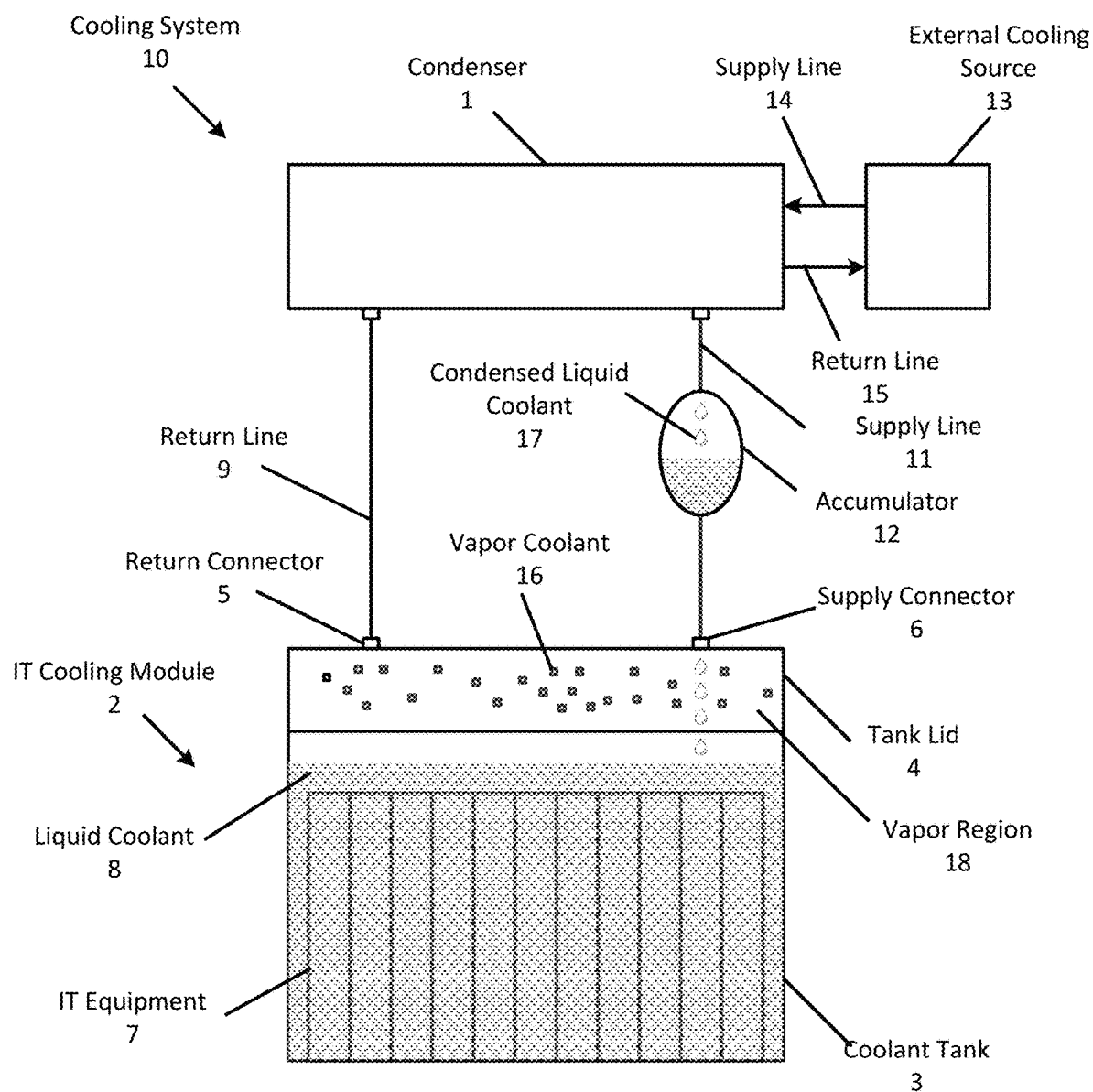
FIG. 1 is a block diagram illustrating an example of an information technology (IT) equipment cooling system according to one embodiment.

Several aspects of the disclosure with reference to the appended drawings are now explained. Whenever the shapes, relative positions and other aspects of the parts described in a given aspect are not explicitly defined, the scope of the disclosure here is not limited only to the parts shown, which are meant merely for the purpose of illustration. Also, while numerous details are set forth, it is understood that some aspects may be practiced without these details. In other instances, well-known circuits, structures, and techniques have not been shown in detail so as not to obscure the understanding of this description. Furthermore, unless the meaning is clearly to the contrary, all ranges set forth herein are deemed to be inclusive of each range's endpoints.

Reference in the specification to "one embodiment" or "an embodiment" means that a particular feature, structure, or characteristic described in conjunction with the embodiment can be included in at least one embodiment of the disclosure. The appearances of the phrase "in one embodiment" in various places in the specification do not necessarily all refer to the same embodiment.

The present disclosure solves the problems described above by providing a full level end-to-end cooling system that can easily deploy immersion cooling with little to no complexity, and that enables a fast and flexible deployment of immersion cooling solution. Furthermore, the cooling system enables a technician to perform maintenance upon the system without breaking the existing cooling loop. Specifically, the present disclosure describes an IT cooling system that maintains a coolant level while the tank is open, thereby allowing the IT equipment being cooled by the system to remain active. In addition, the IT cooling system may be deployed in (an existing) data center, or in a separate module, which allows a user to position the IT cooling system at any location.

According to one embodiment, an information technology (IT) equipment cooling system with one thermal transfer loop architecture for immersion cooling deployment that includes an IT cooling module having one or more pieces of IT equipment that is configured to provide IT services and is at least partially submerged within a liquid coolant. While the IT equipment provides the IT services, the IT equipment generates heat that is transferred into the liquid coolant thereby causing at least some of the liquid coolant to turn into a vapor. The system also includes a condenser that is positioned above the IT cooling module and is configured to condense the vapor back into liquid coolant. The system also includes a return line and a supply line that are both coupled to the condenser and to the IT cooling module to create a heat exchanging loop. The return loop is configured to provide the vapor to the condenser and the supply line is configured to provide the condensed liquid coolant to the IT cooling module. The system also includes an accumulator that is configured to accumulate the condensed liquid coolant before the coolant is provided by the supply line to the IT cooling module.

In one embodiment, the IT cooling module includes a coolant tank that has the one or more pieces of IT equipment at least partially submerged within the liquid coolant and a tank lid on top of the coolant tank and to which the return line and the supply line couple. The tank lid has a vapor region configured to collect the vapor that is provided to the condenser via the return line. In another embodiment, the tank lid includes a first portion that is fixedly coupled to the top of the coolant tank and a second portion that is removably coupled to the top of the coolant tank. In some embodiments, the return line and the supply line couple to the first portion of the tank lid.

In one embodiment, the system further includes a valve that is coupled between the accumulator and the IT cooling module, a liquid level sensor disposed within the IT cooling module and is configured to produce a signal that indicates a coolant level of the liquid coolant within the IT cooling module, and a controller that is configured to maintain a coolant level within the IT cooling module by controlling an opening ratio of the valve responsive to the signal produced by the liquid level sensor.

In another embodiment, the condenser is tilted with respect to the IT cooling module, and the return line is coupled to the condenser at a first location and the supply line is coupled to the condenser at a second location that is lower than the first location. In one embodiment, the condenser is either an air-to-liquid heat exchanger or a liquid-to-liquid heat exchanger. In some embodiments, the IT cooling module includes a supply connector and a return connector, where the supply and return connectors are configured to removably couple to the supply line and the return line, respectively.

According to another embodiment, a data center cooling system includes an IT region, a cooling region that is positioned above the IT region, a cooling source, and at least one IT equipment cooling system that is similar to the IT equipment cooling system as previously described. In particular, an IT cooling module of the IT equipment cooling system is inside the IT region, the condenser is inside the cooling region, and the region may be understood as a data center region, and the return/supply lines pass from the cooling region into the IT region to couple the condenser and the IT cooling module together. Also, the cooling source is coupled to the condenser to create a heat exchanging loop.

In one embodiment, the condenser is a liquid-to-liquid heat exchanger and the cooling source includes a data center liquid cooling system/cooling liquid source, where the cooling region includes a liquid distribution manifold that couples the condenser to the data center liquid cooling system in order to create the second heat exchanging loop for liquid-to-liquid heat exchange. In another embodiment, the condenser is an air-to-liquid heat exchanger and the cooling source includes an air cooling unit, where the cooling region includes an air duct system that is configured to supply cooling air from the air cooling unit or external cooling air source into an inlet of the condenser and direct hot exhaust air from an outlet of the condenser to the air cooling unit or external cooling air source. In one embodiment, the cooling region is separate from the IT region. In one embodiment, the two regions may be considered as two separate modules using a container design concept.

According to another embodiment, an IT cooling system module that includes a cooling portion that includes a condenser and an IT portion that is configured to hold an IT cooling module that has one or more pieces of IT equipment that is configured to provide IT services and is at least partially submerged within a liquid coolant, where, while the IT equipment provides the IT services, the IT equipment generates heat that is transferred into the liquid coolant thereby causing at least some of the liquid coolant to turn into a vapor. The module also includes a return line and a supply line that are both coupled to the condenser, pass from the cooling portion into the IT portion, and are both configured to removably couple to the IT cooling module to create a heat exchanging loop. The return loop is configured to provide the vapor to the condenser that is configured to condense the vapor back into liquid coolant and the supply line is configured to provide the condensed liquid coolant to the IT cooling module. The system also includes an accumulator that is disposed on the supply line in the IT portion and is configured to accumulate the condensed liquid coolant before it is provided to the IT cooling module.

In one embodiment, the heat exchanging loop is a first heat exchanging loop, wherein the cooling portion includes a cooling distribution system and cooling ports, where the cooling distribution couples the condenser to the cooling ports to create a second heat exchanging loop. In another embodiment, the condenser is a liquid-to-liquid heat exchanger, the liquid coolant is a first liquid coolant, and the cooling distribution system is a liquid distribution manifold. The cooling ports are configured to couple to a liquid coolant supply and return loop in order to allow a secondary cooling liquid coolant to circulate through the second heat exchanging loop. In some embodiments, the condenser is an air-to-liquid heat exchanger and the cooling distribution system is an air duct system. The cooling ports are configured to couple to an external air cooling unit that is configured to supply cooling air into the air duct system and receive hot exhaust air from the air duct system. In another embodiment, the cooling portion is above and separate from the IT portion.

FIG. 1 is a block diagram illustrating an example of an IT equipment cooling system according to one embodiment. Specifically, this figure shows an IT equipment cooling system 10 (which hereafter may be referred as cooling system) that is configured to immersion cool one or more pieces of IT equipment. The system includes a condenser 1, an IT cooling module 2, a return line 9, a supply line 11, and an accumulator 12. In one embodiment, the system may include more or less elements as described herein. For example, the system may include several accumulators or instead no accumulator at all. In one embodiment, the system is a single loop immersion cooling system that may be deployed in any (e.g., existing) data center and/or deployed in a separate prefabricated module (e.g., container). More about the deployment of the system is described herein.

The IT cooling module 2 mainly includes a coolant tank 3 and a tank lid 4. In one embodiment, the module may be formed from any type of material (e.g., plastic, metal, etc.). In another embodiment, the tank may be formed from one type of material (e.g., an alloy, etc.), while the lid is formed from a same or different type of material (e.g., plastic, etc.). The coolant tank is configured to hold one or more pieces of IT equipment and liquid coolant. As illustrated, inside the coolant tank are several (e.g., eleven) pieces of IT equipment 7 that are at least partially submerged in a liquid coolant 8. In one embodiment, the module may have any shape and configuration. For example, as illustrated the module is a square box. In other embodiments, however, the module may be a rectangular box or a cylinder. As described herein, the module includes one or more pieces of IT equipment. Thus, the IT cooling module may be sized differently in order to accommodate more (or less) pieces of IT equipment.

In one embodiment, the pieces of IT equipment are configured to provide IT services. Specifically, IT equipment may include a host server (referred to as a host node) coupled to one or more compute servers (also referred to as computing nodes, such as CPU server and GPU server). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the performance computing nodes or compute servers (having one or more GPUs) managed by the host server. In one embodiment, the pieces of IT equipment may perform any type of computing task and/or may be any type of computing device (e.g., a server, a storage device, etc.). In one embodiment, the IT equipment may be edge computing devices. Thus, while the pieces of IT equipment provide the IT services, the equipment generates heat that is transferred into the liquid coolant. More about this process is described herein.

In another embodiment, at least one of the pieces of IT equipment may be a battery backup unit (BBU) that is configured to provide battery backup power to another electronic device, such as an electronic rack that includes one or more pieces of IT equipment, when a (e.g., alternating current (AC) mains) power supply to the electronic rack is unavailable (e.g., during a power outage).

In one embodiment, the liquid coolant 8 may be any type of thermally conductive dielectric liquid. In another embodiment, the coolant may be a non-toxic fluid. In some embodiments, the coolant may be designed and operated to have a low boiling point (e.g., below a threshold operating temperature for at least some of the major components of the pieces of IT equipment in the IT cooling module).

As illustrated, the tank lid 4 is positioned on top of the cooling tank 3 and is configured to create an airtight seal to prevent liquids (e.g., coolant 8) and/or gases (e.g., vapor coolant 16) from leaking out of the IT cooling module. In one embodiment, the lid is removably coupled to the coolant tank. For instance, the lid may be removed in order to allow a technician the ability to perform maintenance on the module to access the IT equipment (e.g., in order to add/remove pieces of IT equipment). In another embodiment, the lid may couple to the coolant tank using any method (e.g., clamps, etc.). In one embodiment, the lid may be configured to be completely removed (e.g., lifted) from the coolant tank, while in another embodiment a portion of the lid may be fixedly coupled to the coolant tank (e.g., via a hinge that is fixed to the tank), where the fixing portion enables thermal recirculation to continue functioning.

In one embodiment, the tank lid 4 may have an interior hollow (e.g., vapor) region 18 that opens into (or is in fluid communication with) the inside of the coolant tank. As described herein, the inside of the lid (or vapor region) is configured to collect vapor coolant 16 that is the result of heat transferred from the IT equipment 7 into the liquid coolant 8, and that is to be provided to the condenser via the return line. In another embodiment, the lid may be solid.

As illustrated, a return line 9 and a supply line 11 both couple the condenser 1 and the IT cooling module 2 together in order to create a (secondary) heat exchanging loop. Specifically, one end of each of the return line 9 and the supply line 11 couple to the condenser 1, while another (opposite) end of the lines couple to the module. The return line 9 is configured to provide vapor coolant 16 to the condenser 1, while the supply line 11 is configured to provide condensed liquid coolant 17 from the condenser to the IT cooling module 2. In one embodiment, the return line may be different than the supply line. For example, the return line may have a diameter that is larger than a diameter of the supply line. In one embodiment, the supply line 11 and the return line 9 may be composed of any material. For instance, the lines may be composed of metal, such as copper, a polymer (e.g., an EPDM rubber), and/or plastic. In one embodiment, the lines may be composed of a flexible material such as rubber. In some embodiments, one line (e.g., the supply line) may be composed of different material than the other line (e.g., the return line).

The supply line 11 includes an accumulator 12 (or reservoir) that is configured to accumulate the condensed liquid coolant 17 before the coolant is provided by the supply line to the IT cooling module 2. In one embodiment, the accumulator provides backup cooling liquid capacity for the system. More about the accumulator is described herein.

In another embodiment, the supply line 11 may include two portions, a first portion of the supply line is coupled between the condenser 1 and the accumulator, while a second portion of the supply line is coupled between the accumulator and the IT cooling module. In one embodiment, both portions may be different in size and/or diameter. For instance, the first portion may have a larger diameter than the second portion. In another embodiment, both portions have the same diameter.

In one embodiment, the return line 9 and the supply line 11 couple to the IT cooling module 2 via a return connector 5 and supply connector 6, respectively. The connectors are positioned on the top of the tank lid 4 and fluidly couple the (inside of the) tank lid (and/or coolant tank) with respective lines. In particular, the return connector 5 and the supply connector 6 are configured to removably couple to the return line 9 and supply line 11, respectively. Thus, both connectors enable the IT cooling module (tank lid) to be disconnected from the heat exchanging loop. In one embodiment, the connectors may be dripless blind mating quick disconnects. In another embodiment, the connectors may be any type of connector that enables a technician to couple supply/return lines to the module 2. In one embodiment, the return/supply lines may couple to the condenser via similar (or different) connectors. In one embodiment, either one side (e.g., either the IT cooling module side or the condenser side) of the supply line 11 and return line 12 are assembled with connectors. Thus, either of the lines may be fixedly assembled with either the IT cooling module or the condenser.

The condenser 1 is a two-phase liquid-to-liquid heat exchanger that is configured to condense vapor into a cooled (condensed) liquid. As described herein, the condenser is coupled to the IT cooling module 2, via the return/supply lines to create a secondary heat exchanging loop. In addition, the condenser 1 is coupled to an external cooling source 13, via a supply line 14 and a return line 15 to create another (primary) heat exchanging loop. In one embodiment, the supply line 14 is configured to supply cooled coolant to the condenser and the return line 15 is configured to draw warmed cooling away from the condenser. For instance, during operation (e.g., while the IT equipment 7 is active) heat generated by the equipment causes at least some of the liquid coolant 8 to turn into (e.g., phase change into) vapor coolant 16. The vapor collects in the vapor region 18 and travels through the return line 9 and into the condenser, which condenses the vapor into liquid coolant 17 by transferring heat from the vapor into coolant that is circulating within the primary heat exchanging loop. The condensed liquid coolant 17 travels through the supply line 11 and back into the coolant tank 3.

In one embodiment, the condenser may be any type of cooling unit that is configured to extract thermal energy. For instance, the condenser may be a single-phase liquid-to-liquid heat exchanger/liquid cooled condenser. As a result, single-phase immersion cooling fluid may be used in the IT cooling module. In another embodiment, the system 10 may include one or more pumps (e.g., as part of one or both of the return line 9 and supply line 11) that are configured to draw liquid coolant 8 from the coolant tank 3 and into the condenser 1.

In one embodiment, the external cooling source 13 may be any source that is configured to draw heat from the coolant that circulates through the primary heat exchanging loop. For example, the source 13 may be a data center cooling water system or an IT liquid cooling water system, or any type of cooling fluid source. As another example, the source 13 may include a liquid distribution manifold (not shown) that couples a heat exchanging source with one or more other IT cooling systems.

Figure 2:
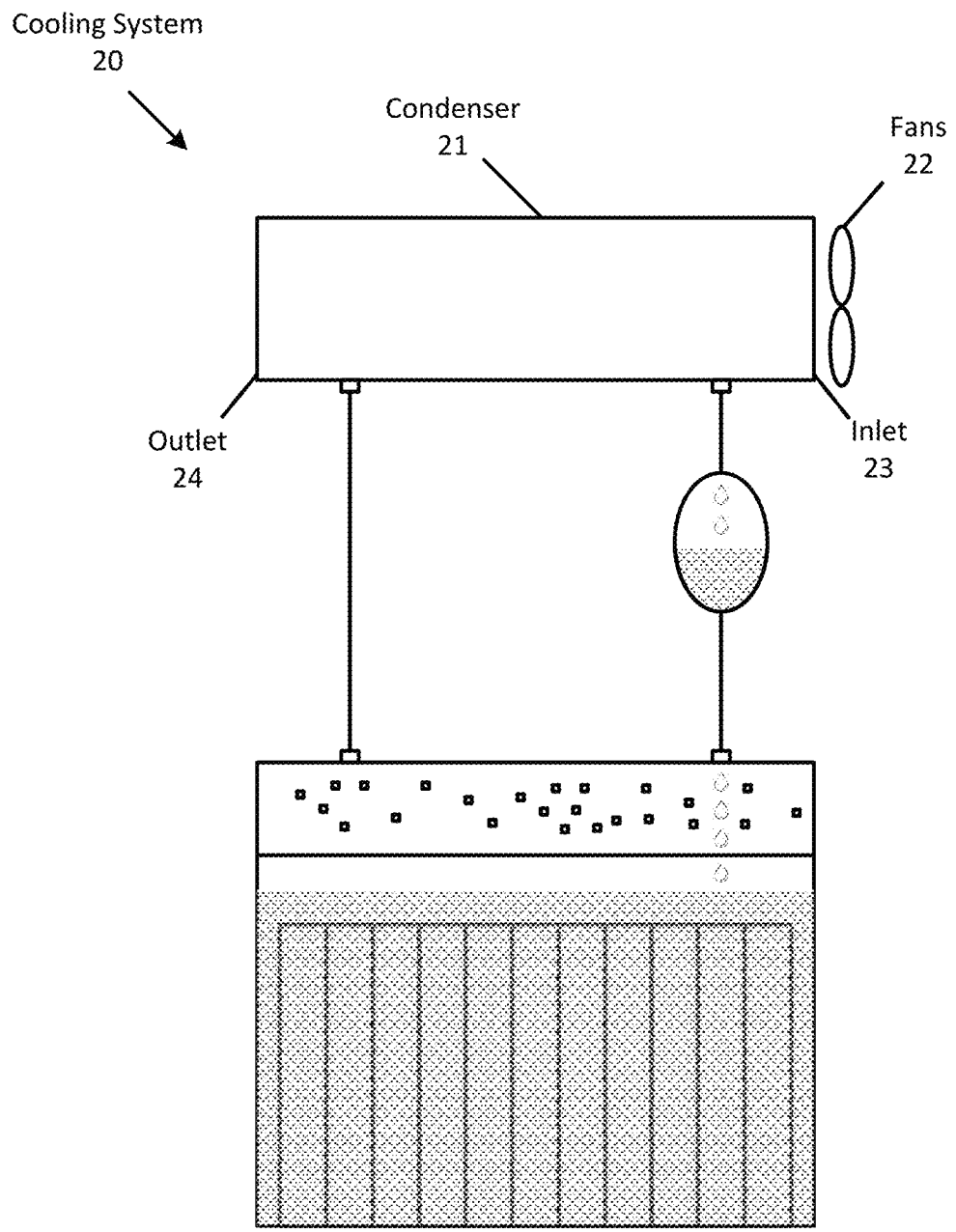
FIG. 2 is a block diagram illustrating another example of an IT equipment cooling system according to one embodiment.

FIG. 2 is a block diagram illustrating another example of an IT equipment cooling system 20 according to one embodiment. As shown, the system 20 includes a condenser 21 that is a two-phase air-to-liquid heat exchanger and one or more fans 22. In one embodiment, the fans 22 may be coupled to the condenser 21. For instance, the fans may be a part of the condenser. As another example, the fans may be a part of a data center air cooling system that are coupled to an inlet 23 of the condenser via an air duct (not shown). More about air ducts is describe herein. Thus, during operation, the fans push (cooled) air into the inlet 23 of the condenser 21. The air travels through the condenser and draws heat from the vapor to condense the vapor back into liquid coolant. The condenser 21 expels hot exhaust air out an outlet 24 (e.g., into an air duct that expels the hot air into the environment). For a single edge deployment, the condenser may be exposed to ambient air directly.

Figure 3:
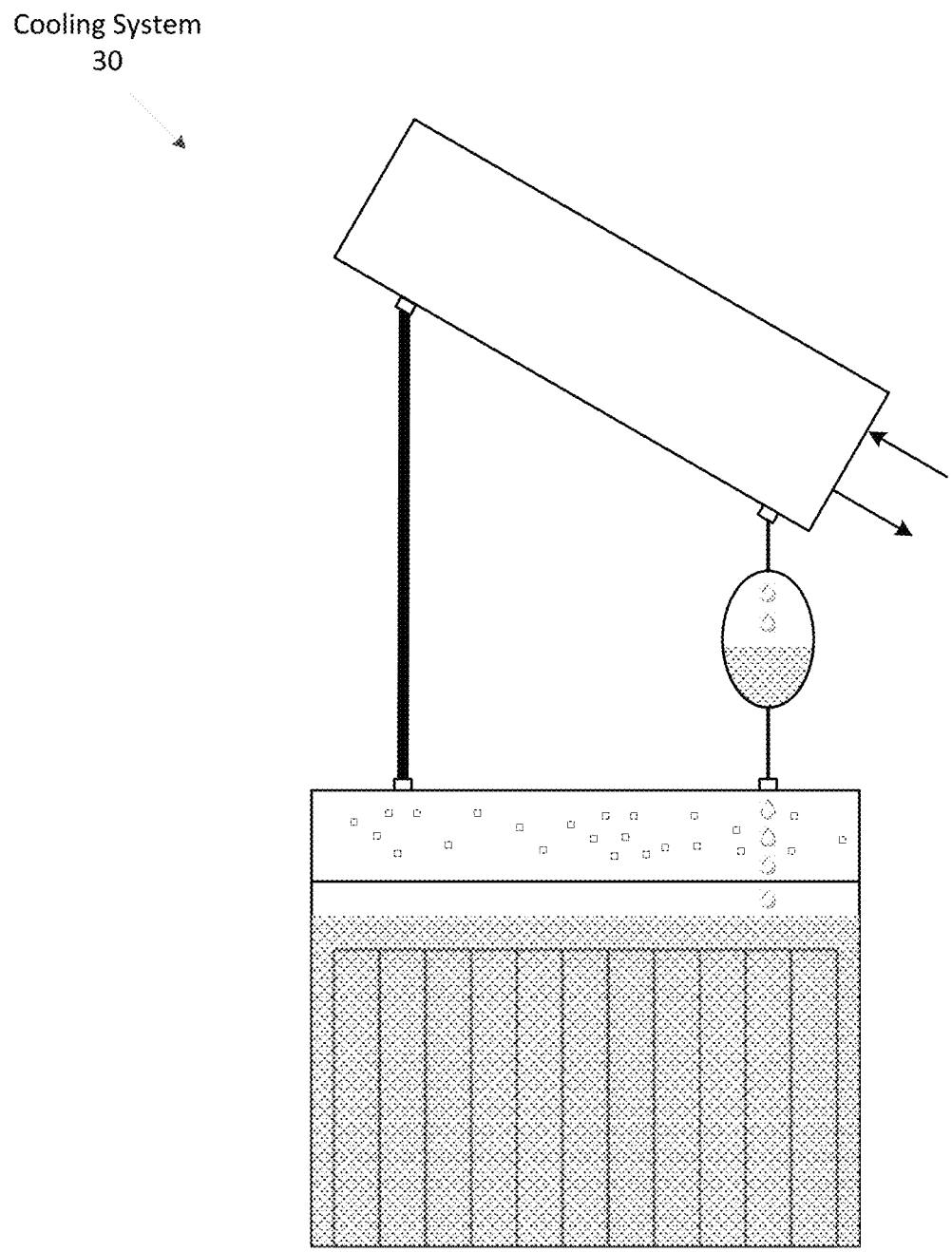
FIG. 3 is a block diagram illustrating an example of an IT equipment cooling system with a tilted condenser according to one embodiment.

FIG. 3 is a block diagram illustrating an example of an IT equipment cooling system 30 with a tilted condenser according to one embodiment. Specifically, this figure illustrates a condenser (e.g., condenser 1) that is tilted with respect to the IT cooling module 2. Thus, the return line is coupled to the condenser at a first location and the supply line is coupled to the condenser at a second location that is lower than the first location. In one embodiment, the supply line is lower because the condensed liquid coolant will naturally travel downward after it is condensed by the condenser. In one embodiment, the condenser may be assembled on the returning line in a vertical manner for better assisting fluid transportation.

Figure 4:
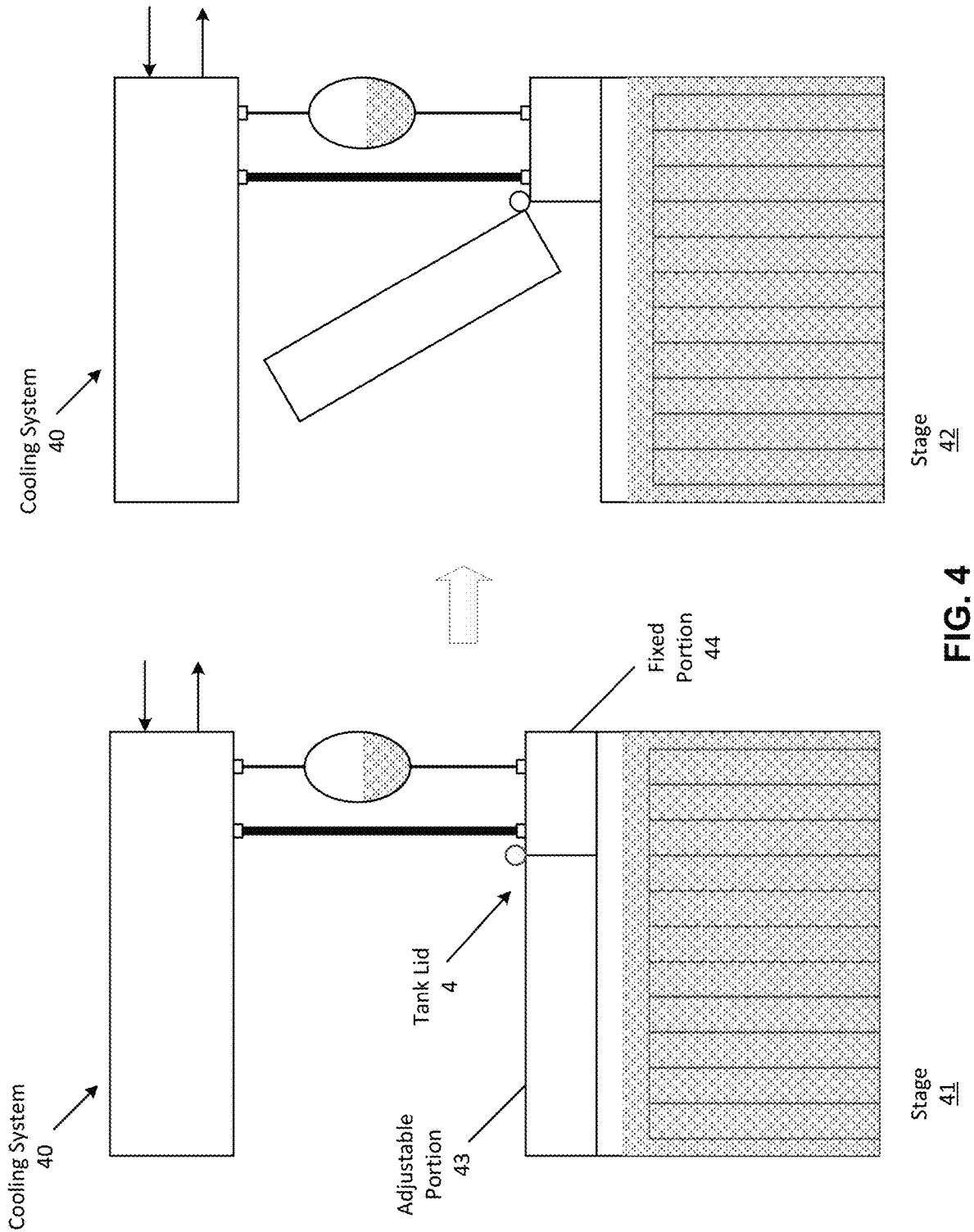
FIG. 4 show several stages in which a tank lid of an IT equipment cooling system closed and then opened according to one embodiment.

FIG. 4 show several stages in which a tank lid of an IT equipment cooling system 40 closed and then opened according to one embodiment. Specifically, this figure illustrates two stages 41 and 42 that show the tank lid closed and then opened. As illustrated, the tank lid 4 includes two portions: a (first) fixed portion 44 and a (second) adjustable portion 43. The fixed portion is fixedly coupled to the top of the coolant tank 3. For example, the fixed portion may be a part of the coolant tank (e.g., where both are one integrated unit). As another example, the fixed portion and the coolant tank may be joined together via a fastener (e.g., rivet, screw, adhesive, etc.). In contrast, the adjustable portion 43 is removably coupled to the top of the coolant tank. As illustrated, the adjustable portion is coupled to the fixed portion via a hinge. In one embodiment, the adjustable portion may be removed entirely (e.g., decoupled from the fixed portion and the coolant tank). In one embodiment, the adjustable portion may be coupled to the top of the coolant tank (and/or to the fixed portion) via any type of coupling mechanism (e.g., a clamp, etc.). Also illustrated, the return line 9 and the supply line 11 couple to the fixed portion 44 of the tank lid 4. In one embodiment, either line may couple to either the adjustable portion or the fixed portion.

The first stage 41 shows that the tank lid is closed. Specifically, the adjustable portion 43 is coupled to the top of the coolant tank. As described herein, while the adjustable portion is coupled to the top of the coolant tank an airtight seal is created that prevents liquids/gases from entering/exiting the cooling system. The second stage 42 shows the tank lid is opened. In particular, the adjustable portion 43 is decoupled from the coolant tank, thereby allowing access to the inside of the coolant tank.

Figure 5:
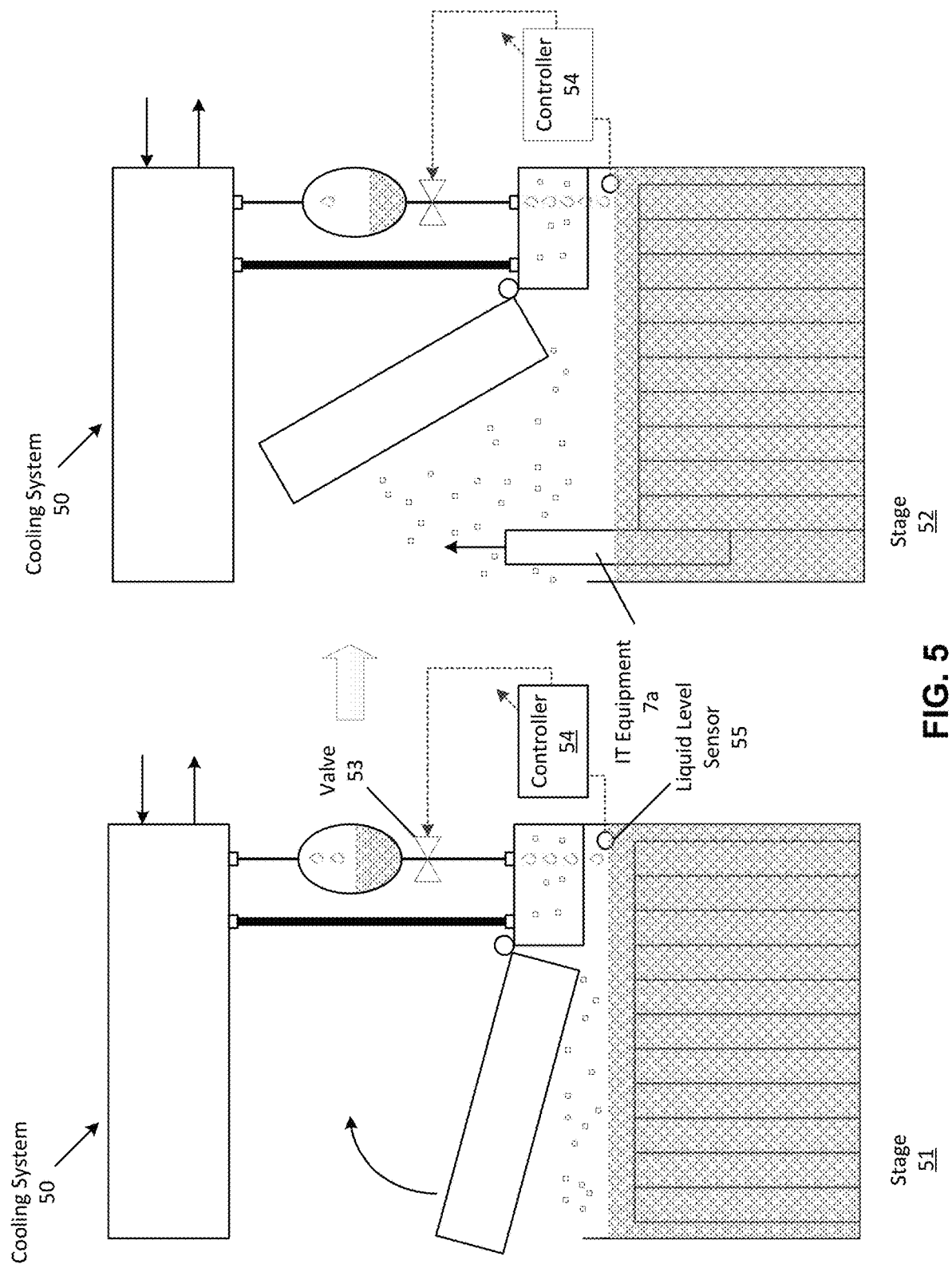
FIG. 5 shows several stages in which a valve is controlled to maintain a liquid coolant level according to one embodiment.

FIG. 5 shows several stages in which a valve is controlled to maintain a liquid coolant level in combination with the fluid accumulator while a piece of IT equipment is being removed from the IT cooling module according to one embodiment. This figure illustrates a cooling system 50, which includes a valve 53, a controller 54, and a liquid level sensor 55. The valve 53 is coupled to the supply line 11 and is configured to allow (or prevent) condensed liquid coolant 17 to travel (from the accumulator) through (a remainder) of the supply line into the coolant tank 3. Specifically, the valve is coupled between the accumulator 12 and the (supply connector 6 of the) IT cooling module 2. As described herein, an opening ratio of the valve may be adjusted (by the controller 54) in order to control (or adjust) a flow rate of condensed liquid coolant that enters the coolant tank. In one embodiment, instead of (or in addition to) the valve 53, the system may include a valve on the return line 9.

The liquid level sensor 55 is disposed within the (coolant tank of the) IT cooling module and is configured to sense a (current) level of the liquid coolant and to produce an electrical signal that indicates (or represents) the coolant level within the cooling tank. In one embodiment, the sensor 55 may be any type of sensor (e.g., a float switch, an ultrasonic level sensor, etc.) that is configured to detect a level of liquid coolant 8 within the IT cooling module 2. In one embodiment, the liquid level sensor (and/or an additional liquid level sensor) may be disposed within the accumulator.

The controller 54 may be a special-purpose processor such as an application-specific integrated circuit (ASIC), a general purpose microprocessor, a field-programmable gate array (FPGA), a digital signal controller, or a set of hardware logic structures (e.g., filters, arithmetic logic units, and dedicated state machines). In one embodiment, the controller may be a circuit with a combination of analog elements (e.g., resistors, capacitors, inductors, etc.) and/or digital elements (e.g., logic-based elements, such as transistors, etc.). The controller may also include memory. In one embodiment, the controller may be a part (or integrated) into the IT cooling module. In another embodiment, the controller may be one of the pieces of IT equipment that is at least partially submerged within the coolant 8.

In one embodiment, the controller 54 is communicatively coupled (e.g., wired and/or wirelessly connected) to the valve 53 and/or the liquid level sensor 55. Specifically, the controller is configured to receive a current coolant level (as the electrical signal) from the sensor and to control the valve (e.g., by transmitting a control signal to control circuitry of the valve, such as an electronic switch) in order to adjust an opening ratio of the valve (e.g., to at least partially open the valve, open the valve all the way, or close the valve). In one embodiment, the controller may control the valve based on the current coolant level. More about how the controller controls the valve is described herein.

As described herein, the controller may control the valve in order to maintain a minimum coolant level within the coolant tank. The two stages of FIG. 5 illustrate such a scenario. Stage 51 shows that the tank lid is being opened (e.g., the adjustable portion of the lid is being opened), while the cooling system is in operation (e.g., the pieces of IT equipment are active (e.g., providing IT services) and are therefore generating heat, which causes the liquid vapor to be produced). When the lid is being opened, the fluid recirculation loop is broken. The liquid continues to vaporize and as a result, less condensed liquid coolant is flowing back to the tank. Therefore, the control valve is needed to adjust its opening ratio to maintain the coolant level. Right before the lid was being opened, the vapor was contained within the IT cooling module (e.g., within the lid and/or a portion of the coolant tank), and the system may have been at a steady state. In other words, the condenser is condensing a steady stream of cooling liquid and the controller has set the valve to an opening ratio (e.g., 50%) based on the coolant level. This is allowing the condensed coolant form the accumulator to enter the coolant tank at a first flow rate, which may ensure that the coolant level within the tank does not drop below a threshold. This stage also illustrates that the coolant level within the accumulator is about half.

Stage 52 illustrates that a piece of IT equipment 7a is being removed from the cooling module by a technician. In this scenario, not only the thermal loop is broken, which causes less condensed coolant to flow back to the tank, but more volume of coolant is needed to occupy the space for maintaining the coolant level within the IT cooling module.

For instance, the equipment may be inoperative and/or needs to be replaced with a different piece of equipment. Since the piece of IT equipment 7a displaces coolant while in the tank, as it is being removed coolant replaces the volume space that once occupied the equipment. In response, the coolant level may begin to drop, which is measured (or sensed) by the liquid level sensor 55 and transmitted to the controller 54. In order to maintain a (predetermined) coolant level, the controller has adjusted the opening ratio of the valve 53 (e.g., having a new opening ratio of 75%), allowing more condensed coolant from the accumulator to enter the coolant tank at a second flow rate that is faster than the first. This is illustrated as five drops of coolant entering the tank from the supply line, rather than four drops as illustrated in stage 51. Thus, the controller maintains a coolant level within the tank, ensuring that the existing pieces of IT equipment that are active within the tank remain submerged in coolant. Also, since the coolant is flowing faster from the accumulator, the coolant level of the accumulator has dropped.

In one embodiment, to adjust the opening ratio the controller may compare the sensed coolant level to threshold level. If the current coolant level is below the threshold, the controller may adjust the opening ratio by a predetermined amount (e.g., 1%, 2%, 3%, etc.). In another embodiment, the controller may use multiple coolant level readings from two or more liquid level sensors to determine how to adjust the opening ratio of the valve. For example, as described herein, the coolant tank and the accumulator may include separate liquid level sensors. The controller may compare coolant levels within the coolant tank and the accumulator to adjust the opening ratio. For instance, if the coolant tank coolant level is below a (first) threshold, but the accumulator coolant level is above a (second) threshold, the controller may increase the opening ratio in order to allow more coolant into the tank.

Also illustrated in this stage is a reduction in the liquid coolant that is condensed by the condenser. Specifically, as previously described, before the lid was opened, most of the liquid being produced within the coolant tank was being provided to the condenser. Since the lid is opened in stage 52, however, a considerable amount of vapor is escaping into the ambient environment, rather than traveling through the return line into the condenser and being produced back to liquid. This causes the condenser to condense less coolant than in the previous stage (this is illustrated as a single drop of liquid coolant entering the accumulator, rather than two drops).

In one embodiment, the accumulator 12 may have an access point, such as an opening with a cap (e.g., screwable cap) that is configured to removably couple to the opening. The opening may enable a technician to add coolant into the accumulator in order to add coolant into the system during any time either under normal operating conditions or abnormal operating conditions. In one embodiment, the opening may be coupled to a coolant source/coolant makeup unit, via a valve that is controlled by the controller. The controller may be configured to adjust the valve in order to add additional coolant into the accumulator as needed. In one embodiment, the controller may use coolant level readings from a liquid level sensor disposed within the accumulator to determine whether to add additional liquid coolant (e.g., adding coolant when the level within the accumulator is below a threshold).

In another embodiment, when adding one piece of IT equipment to the tank, then more volume is taken by the IT equipment, therefore the fluid level may increase after the lid is closed. Therefore, the opening ratio of the valve may be decreased for a certain period of time in order to decrease the fluid level within the IT cooling module. During this period of time, more of the fluid from the condenser may accumulate in the accumulator. When the fluid level returns back to the normal level, the valve adjust its opening ratio back to normal.

In another embodiment, the coolant tank may include a drain valve (not shown) that is communicatively coupled to the controller 54, and is configured to drain coolant out of the coolant tank. Specifically, the controller may control the drain valve to release coolant from the tank when the coolant level exceeds a threshold in order to ensure that the tank does not overflow when another piece of IT equipment replaces the one that has been removed.

Figure 6:
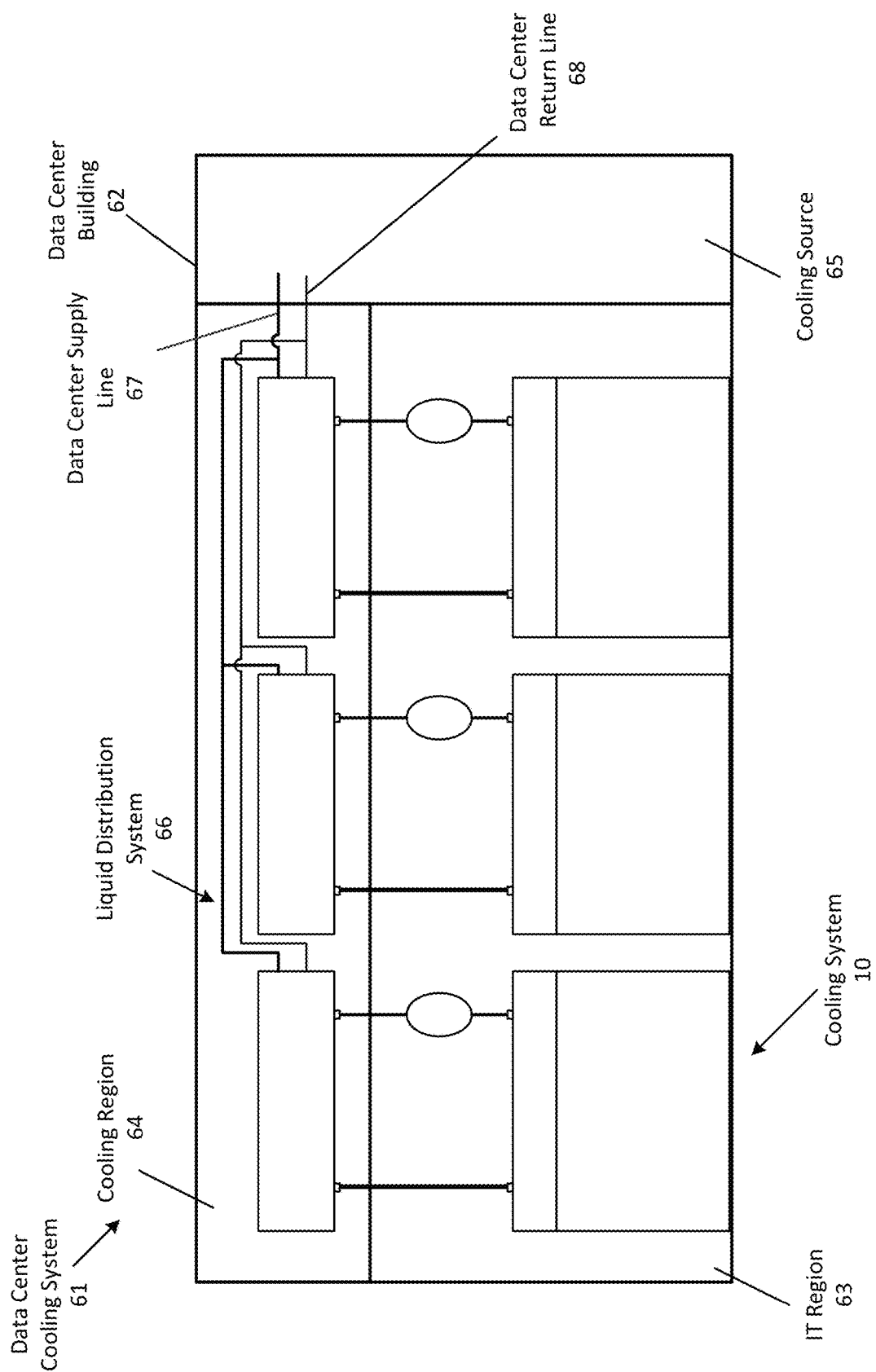
FIG. 6 is a block diagram of an example of a data center cooling system according to one embodiment.

FIG. 6 is a block diagram of an example of a data center cooling system according to one embodiment. Specifically, this figure illustrates a data center cooling system 61 that includes a data center building 62 with an IT region 63, a cooling region 64, and a cooling (liquid) source 65. As illustrated, the cooling region is positioned above the IT region. In one embodiment both regions may be part of a data center room which is partitioned by a wall (or barrier) to create both regions. In another embodiment, both regions are at least partially in fluid communication with one another. In some embodiments, the cooling region and the IT region may be designed and built independently and assembled together with an existing cooling source (e.g., cooling source 65) of an existing data center building.

As shown, the data center cooling system 61 includes three cooling systems 10. In one embodiment, the data center cooling system may include more or less cooling systems. Each of the cooling systems 10 are separated between the cooling region and the IT region. For each cooling system, a condenser 1 is positioned within the cooling region 64 and a IT cooling module 2 (and accumulator 12) is positioned within the IT region. The supply line 11 and the return line 9 both couple the condenser and IT cooling module together, while passing from the cooling region into the IT region. In one embodiment, the arrangement of the cooling systems may be different. For example, the accumulator may be positioned in the cooling region 64.

The cooling region 64 includes a liquid distribution system (or manifold) 66 that couples each of the condensers to a data center supply line 67 and a data center return line 68. The supply line 67 and the return line 68 both couple to the cooling source 65, which may be any type of data center liquid cooling system. Cooling source 65 may be part of an existing data center infrastructure. Thus, each of the condensers couples to the cooling source 65 to create a heat exchanging loop for liquid-to-liquid heat exchange, as described herein.

Figure 7:
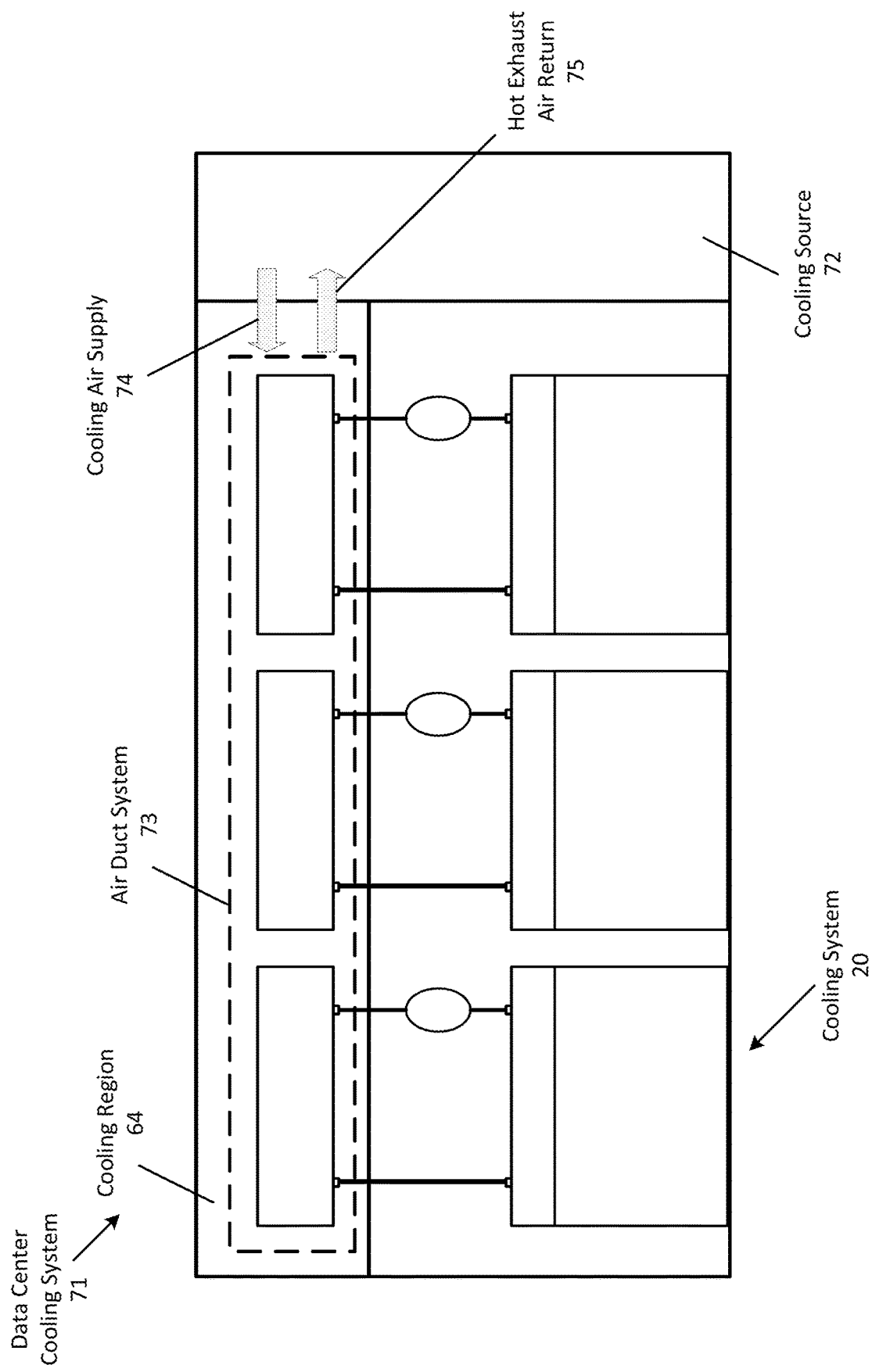
FIG. 7 is a block diagram of another example of a data center cooling system according to one embodiment.

FIG. 7 is a block diagram of another example of a data center cooling system according to one embodiment. Specifically, this figure illustrates a data center cooling system 71 that uses air cooling in the cooling region 64, rather than liquid cooling as illustrated in FIG. 6. For instance, the data center cooling system 71 includes cooling systems 20 that include condensers 21 that are air-to-liquid heat exchangers. In this figure, the cooling source 72 is a data center air cooling unit, such as a computer room air conditioning (CRAC) unit that cools hot air and circulates the air into the cooling region or a fresh air wall from direct free air cooling solution. In another embodiment, the cooling source may be an external cooling air source. For instance, the cooling source 72 may provide cold air through a cooling air supply 74 into the cooling region, and receive hot exhaust air through an air return 75. As illustrated, the cooling region includes an air duct system 73 that is configured to direct (supply) cold air from the air cooling unit to at least one of the condensers and supply hot exhaust air from at least one of the condensers to the air cooling unit. In particular, this system 73 may couple the cooling air supply 74 to the inlet of each condenser, via at least one air duct, and couple the hot exhaust air return 75 to the outlet of each condenser, via at least one air duct. In one embodiment, the air duct system 73 may only include air ducts coupled to the outlet of each condenser to the air return 75, while the air supply 74 provides the cold air into the cooling region directly.

Figure 8:
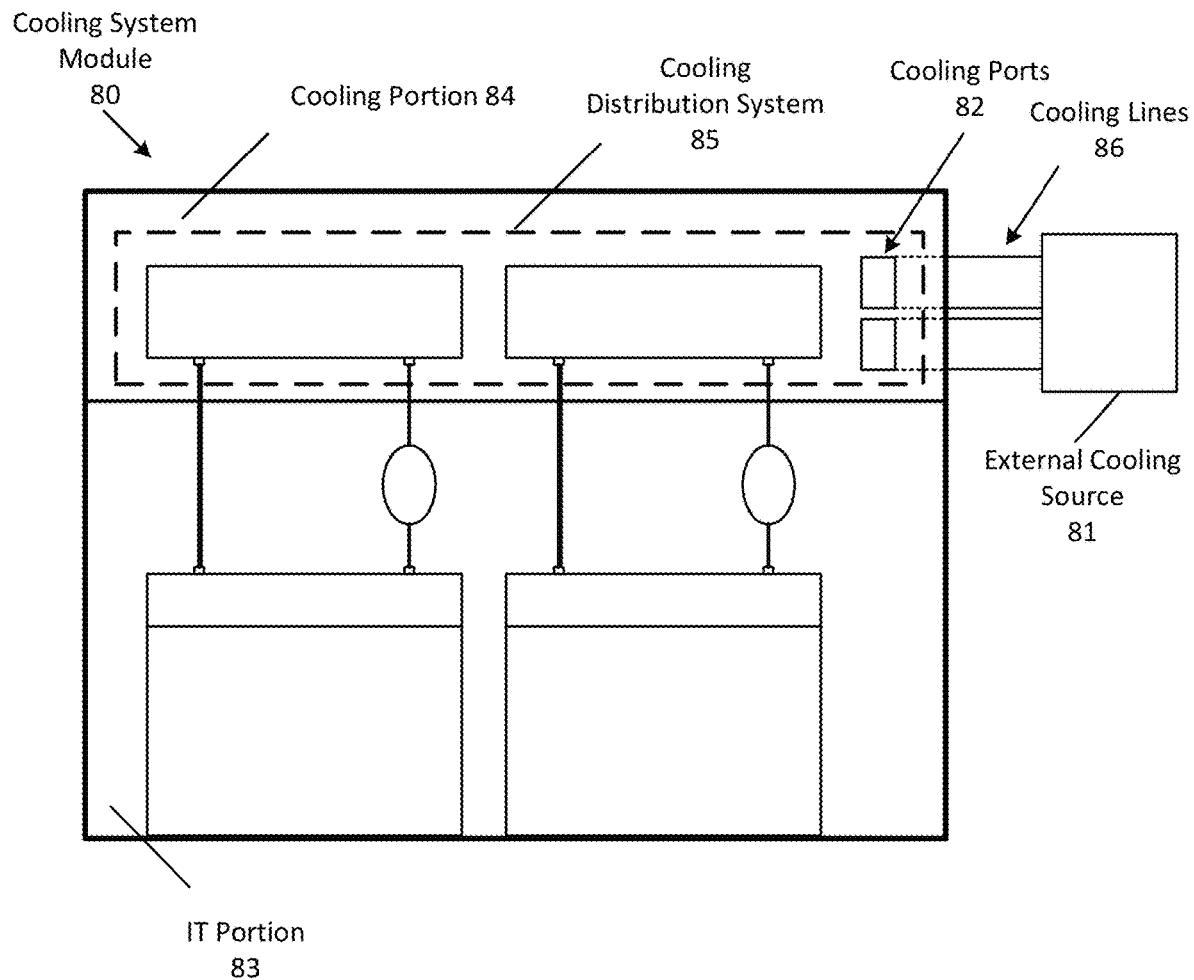
FIG. 8 is a block diagram of an example of a cooling system module according to one embodiment.

FIG. 8 is a block diagram of an example of a cooling system module according to one embodiment. In particular, this figure shows a cooling system module 80 that includes one or more IT cooling systems as described herein. For instance, the module 80 includes a cooling portion 84 and an IT portion. As illustrated, the cooling portion is above the IT portion. The cooling portion is configured to hold one or more condensers and the IT portion 83 is configured to hold one or more corresponding IT cooling modules of the IT cooling system. For each IT cooling system, a return line and a supply line are both coupled to a condenser and an IT cooling module, and pass from the cooling portion 84 into the IT portion 83. In one embodiment, both portions are separate from each other (e.g., partitioned by a wall or ceiling). In another embodiment, both portions are in fluid communication with one another. In some embodiments, the cooling system module 82 may be prefabricated with one or more elements described herein. For instance, the module 82 may be a container that is fabricated with both portions 83 and 84, and at least some of the elements for each of the IT cooling systems. Specifically, the module may include one or more condensers that are coupled to a supply and a return line, and one or more IT cooling modules (e.g., IT cooling module 2) may be added into the module 80 (e.g., after deployment at a designated location).

As described herein, the module 80 may be prefabricated. As a result, the module 80 may be relocated from one location to another. For instance, once positioned at a desired location, cooling ports 82 may be coupled to an external cooling source 84 (via cooling lines 86) in order to enable immersion cooling of IT equipment. Thus, the module 80 allows for immersion cooling at any location rather than a specific location, such as at a data center.

The cooling portion 84 includes a cooling distribution system 85 and cooling ports 82. The cooling distribution system couples each of the condensers to the cooling ports 82, and the ports may be coupled to the external cooling source 84 (via cooling lines 86) in order to create a heat exchanging loop, as described herein. In one embodiment, the module 80 may be fabricated to accommodate liquid cooling and/or air cooling. For example, when the condensers are liquid-to-liquid heat exchangers, the cooling distribution system 85 may be a liquid distribution system, similar to the system 66 of FIG. 6. The ports (which in this case may be connectors as described herein) are configured to couple to an external cooling source 81, such as a liquid cooling system (which includes a liquid coolant supply and return loop), via cooling lines 86 that may be liquid lines in order to allow coolant to circulate through a liquid-to-liquid heat exchanging loop.

As another example, when the condensers are air-to-liquid heat exchangers, the cooling distribution system may be an air duct system, similar to the system 73 of FIG. 7. The ports (which in this case may be an air inlet and an air outlet) are configured to couple to the external cooling source, such as an external air cooling unit that is configured to supply cooling air into the system 85 and receive hot exhaust air from the system, via cooling lines 86 that may be separate air ducts thereby creating an air-to-liquid heat exchanging loop.

In one embodiment, any of the IT cooling systems (e.g., 10, 20, 30, 40, and 50) described herein may be a part of any of the data center cooling systems 61 and 71 and/or the cooling system module 80. In another embodiment, any of the IT cooling systems may include elements of other systems. For example, cooling system 10 may include the valve 53 and controller 54 of system 50.

As previously explained, an embodiment of the disclosure may be (or include) a non-transitory machine-readable medium (such as microelectronic memory) having stored thereon instructions, which program one or more data processing components (generically referred to here as a "processor") to perform cooling operations, such as controlling an opening ratio of a valve disposed on the supply line in order to maintain a liquid coolant level within the IT cooling module. In other embodiments, some of these operations might be performed by specific hardware components that contain hardwired logic. Those operations might alternatively be performed by any combination of programmed data processing components and fixed hardwired circuit components.

In the foregoing specification, embodiments of the disclosure have been described with reference to specific exemplary embodiments thereof. It will be evident that various modifications may be made thereto without departing from the broader spirit and scope of the disclosure as set forth in the following claims. The specification and drawings are, accordingly, to be regarded in an illustrative sense rather than a restrictive sense.

While certain aspects have been described and shown in the accompanying drawings, it is to be understood that such aspects are merely illustrative of and not restrictive on the broad disclosure, and that the disclosure is not limited to the specific constructions and arrangements shown and described, since various other modifications may occur to those of ordinary skill in the art. The description is thus to be regarded as illustrative instead of limiting.

In some aspects, this disclosure may include the language, for example, "at least one of [element A] and [element B]." This language may refer to one or more of the elements. For example, "at least one of A and B" may refer to "A," "B," or "A and B." Specifically, "at least one of A and B" may refer to "at least one of A and at least one of B," or "at least of either A or B." In some aspects, this disclosure may include the language, for example, "[element A], [element B], and/or [element C]." This language may refer to either of the elements or any combination thereof. For instance, "A, B, and/or C" may refer to "A," "B," "C," "A and B," "A and C," "B and C," or "A, B, and C."

What is claimed is:

1. An Information Technology (IT) equipment cooling system, comprising
    an IT cooling module comprising
        a coolant tank having one or more pieces of IT equipment that is configured to provide IT services and is at least partially submerged within a liquid coolant, wherein, while the IT equipment provides the IT services, the IT equipment generates heat that is transferred into the liquid coolant thereby causing at least some of the liquid coolant to turn into a vapor, and
        a tank lid on top of the coolant tank, the tank lid having a vapor region configured to collect the vapor, wherein the tank lid comprises a first portion that is fixedly coupled to the top of the coolant tank and a second portion that is removably coupled to the top of the coolant tank, wherein the tank lid is open when the second portion is removed from the top of the coolant tank;
    a condenser that is positioned above the IT cooling module and is configured to condense the vapor back into liquid coolant;
    a return line and a supply line that are both coupled to the condenser and to the first portion of the tank lid to create a heat exchanging loop, wherein the return line is configured to provide the vapor from the vapor region to the condenser; and
    a reservoir coupled to the supply line and is configured to receive and accumulate the condensed liquid coolant, and is configured to provide the accumulated coolant to the coolant tank, via the supply line,
    wherein the IT equipment is configured to continue providing IT services, the condenser is configured to continue condensing vapor back into liquid coolant, and the reservoir is configured to continue providing the accumulated coolant to the coolant tank while the tank lid is open.

2. The IT equipment cooling system of claim 1, wherein the second portion is coupled to the first portion via a hinge.

3. The IT equipment cooling system of claim 1, wherein the reservoir comprises an access point for adding additional coolant into the reservoir.

4. The IT equipment cooling system of claim 1, further comprising
    a valve that is coupled to the supply line and is disposed between the reservoir and the IT cooling module;
    a liquid level sensor disposed within the coolant tank and is configured to produce a signal that indicates a coolant level of the liquid coolant within the coolant tank; and
    a controller that is configured to maintain a coolant level within the IT cooling module by controlling an opening ratio of the valve responsive to the signal produced by the liquid level sensor.

5. The IT equipment cooling system of claim 4, wherein the valve is configured to have a first opening ratio that allows the accumulated coolant from the reservoir to flow into the coolant tank at a first flow rate while the tank lid is closed, and the valve is configured to have a second opening ratio that allows the accumulated coolant from the reservoir to flow into the coolant tank at a second flow rate faster than the first flow rate while the tank lid is open.

6. The IT equipment cooling system of claim 1, wherein the condenser is tilted with respect to the IT cooling module, wherein the return line is coupled to the condenser at a first location and the supply line is coupled to the condenser at a second location that is lower than the first location.

7. The IT equipment cooling system of claim 1, wherein the condenser is either an air-to-liquid heat exchanger or a liquid-to-liquid heat exchanger.

8. The IT equipment cooling system of claim 1, wherein the IT cooling module comprises a supply connector and a return connector, wherein the supply and return connectors are configured to removably couple to the supply line and return line, respectively.

9. A data center cooling system comprising:
    an information technology (IT) region;
    a cooling region that is positioned above the IT region; and at least one IT equipment cooling system, comprising
an IT cooling module inside the IT region and comprising
a coolant tank having one or more pieces of IT equipment that are configured to provide IT services and are at least partially submerged within a liquid coolant, wherein, while the IT equipment provide the IT services, the IT equipment generate heat that is transferred into the liquid coolant thereby causing at least some of the liquid coolant to turn into a vapor, and
a tank lid on top of the coolant tank, the tank lid having a vapor region configured to collect the vapor, wherein the tank lid comprises a first portion that is fixedly coupled to the top of the coolant tank and a second portion that is removably coupled to the top of the coolant tank, wherein the tank lid is open when the second portion is removed from the top of the coolant tank,
a condenser inside the cooling region,
a return line and a supply line that are both coupled to the condenser, pass from the cooling region into the IT region, and are both coupled to the first portion of the tank lid to create a first heat exchanging loop, the return line is configured to provide the vapor from the vapor region to the condenser that is configured to condense the vapor back into liquid coolant,
a reservoir that is in the IT region and is coupled to the supply line, the reservoir is configured to receive and accumulate the condensed liquid coolant, and is configured to provide the accumulated coolant to the coolant tank, via the supply line; and
a cooling source that is coupled to condenser of each of the at least one IT equipment cooling system to create a second heat exchanging loop,
wherein the IT equipment is configured to continue providing IT services, the condenser is configured to continue condensing vapor back into liquid coolant, and the reservoir is configured to continue providing the accumulated coolant to the coolant tank while the tank lid is open.

10. The data center cooling system of claim 9, wherein the condenser is a liquid-to-liquid heat exchanger and the cooling source comprises a data center liquid cooling system/cooling liquid source, wherein the cooling region comprises a liquid distribution manifold that couples the condenser to the data center liquid cooling system/cooling liquid source in order to create the second heat exchanging loop for liquid-to-liquid heat exchange.

11. The data center cooling system of claim 9, wherein the condenser is an air-to-liquid heat exchanger and the cooling source comprises an air cooling unit, wherein the cooling region comprises an air duct system that is configured to supply cooling air from the data center air cooling unit or external cooling air source into an inlet of the condenser and direct hot exhaust air from an outlet of the condenser to the air cooling unit or external cooling air source.

12. The data center cooling system of claim 9, wherein the cooling region is separate from the IT region by a barrier, wherein the supply and return lines pass from the cooling region into the IT region through the barrier.

13. The data center cooling system of claim 9, wherein the second portion is coupled to the first portion via a hinge.

14. The data center cooling system of claim 9, wherein the first portion comprises a supply connector and a return connector, wherein the supply and return connectors are configured to removably couple to the supply line and return line, respectively.

15. The data center cooling system of claim 9, wherein the at least one IT equipment cooling system further comprises
a valve that is coupled to the supply line and is disposed between the reservoir and the IT cooling module;
a liquid level sensor disposed within the coolant tank and is configured to produce a signal that indicates a coolant level of the liquid coolant within the coolant tank; and
a controller that is configured to maintain a coolant level within the IT cooling module by controlling an opening ratio of the valve responsive to the signal produced by the liquid level sensor.

16. The data center cooling system of claim 15, wherein the valve is configured to have a first opening ratio that allows the accumulated coolant from the reservoir to flow into the coolant tank at a first flow rate while the tank lid is closed and the valve is configured to have a second opening ratio that allows the accumulated coolant from the reservoir to flow into the coolant tank at a second flow rate faster than the first flow rate while the tank lid is open.

17. An Information Technology (IT) cooling system module, comprising:
a cooling portion that includes a liquid-to-liquid heat exchanger, a liquid distribution system, and cooling ports, wherein the liquid distribution system couples the heat exchanger to the cooling ports to create a first heat exchanging loop, and the cooling ports are configured to couple to a liquid cooling system in order to allow a first liquid coolant to circulate through the first heat exchanging loop;
an IT portion that is configured to hold an IT cooling module that has one or more pieces of IT equipment that is configured to provide IT services and is at least partially submerged within a second liquid coolant, wherein, while the IT equipment provides the IT services, the IT equipment generates heat that is transferred into the second liquid coolant thereby causing at least some of the second liquid coolant to turn into a vapor;
a return line and a supply line that are both coupled to the heat exchanger, pass from the cooling portion into the IT portion, and are both configured to removably couple to the IT cooling module to create a second heat exchanging loop, the return line is configured to provide the vapor to the heat exchanger that is configured to condense the vapor back into liquid coolant and the supply line is configured to provide the condensed liquid coolant to the IT cooling module; and
an accumulator that is in the IT portion and is configured to accumulate the condensed liquid coolant before it is provided by the supply line to the IT cooling module.

18. The IT cooling system module of claim 17, wherein the cooling portion is above and separate from the IT portion.

19. The IT cooling system module of claim 18, wherein the IT cooling system module comprises a container within which the cooling portion and the IT portion are integrated.

* * * * *